US007982505B2

(12) United States Patent
Takeda

(10) Patent No.: US 7,982,505 B2
(45) Date of Patent: Jul. 19, 2011

(54) LOGIC CIRCUIT, ADDRESS DECODER CIRCUIT AND SEMICONDUCTOR MEMORY

(75) Inventor: Koichi Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 31 days.

(21) Appl. No.: 12/518,793

(22) PCT Filed: Dec. 12, 2007

(86) PCT No.: PCT/JP2007/073909
§ 371 (c)(1),
(2), (4) Date: Oct. 5, 2009

(87) PCT Pub. No.: WO2008/072649
PCT Pub. Date: Jun. 19, 2008

(65) Prior Publication Data
US 2010/0141301 A1    Jun. 10, 2010

(30) Foreign Application Priority Data

Dec. 12, 2006 (JP) .................. 2006-334645

(51) Int. Cl.
*H03K 19/20* (2006.01)
*G11C 8/00* (2006.01)

(52) U.S. Cl. .............. 326/105; 365/230.06; 365/230.01; 326/104

(58) Field of Classification Search ............ 365/230.01, 365/230.06; 326/104–105
See application file for complete search history.

(56) References Cited

U.S. PATENT DOCUMENTS

| 5,550,781 | A | * | 8/1996 | Sugawara et al. ............. 365/222 |
| 5,793,688 | A | * | 8/1998 | McLaury ...................... 365/203 |
| 5,850,368 | A | * | 12/1998 | Ong et al. .................. 365/238.5 |
| 5,883,529 | A | * | 3/1999 | Kumata et al. .................. 326/93 |
| 5,923,604 | A | * | 7/1999 | Wright et al. ............ 365/189.15 |
| 6,005,814 | A | * | 12/1999 | Mulholland et al. .......... 365/201 |
| 6,049,488 | A | * | 4/2000 | Sawada .................... 365/189.05 |
| 6,081,136 | A | * | 6/2000 | Khanna et al. .................. 326/95 |
| 6,198,686 | B1 | * | 3/2001 | Takita et al. ............. 365/230.06 |

(Continued)

FOREIGN PATENT DOCUMENTS

JP  1999102586 A  4/1999

(Continued)

OTHER PUBLICATIONS

International Search Report for PCT/JP2007/073909 mailed Mar. 11, 2008.

*Primary Examiner* — Rexford N Barnie
*Assistant Examiner* — Matthew C Tabler

(57) ABSTRACT

Disclosed is a logic circuit includes a first NAND gate that receives a first pulse signal and a first selection signal, a first inverter gate that inverts an output signal of the first NAND gate to output a resulting signal, a second NAND gate that receives a second pulse signal and the first selection signal, a second inverter gate that inverts an output signal of the second NAND gate, a first PMOS transistor with a drain terminal connected to an output of the first NAND gate, a gate terminal connected to an output of the second NAND gate and a source terminal connected to a power supply voltage, and a first NMOS transistor with a drain terminal connected to an output of the first inverter gate, a gate terminal connected to an output of the second inverter gate and a source terminal connected to a ground potential.

17 Claims, 11 Drawing Sheets

U.S. PATENT DOCUMENTS

| | | |
|---|---|---|
| 6,243,320 B1 * | 6/2001 | Hamamoto et al. ...... 365/230.08 |
| 6,452,423 B1 * | 9/2002 | Das et al. ....................... 326/113 |
| 6,552,940 B1 * | 4/2003 | Shore ............................ 365/201 |
| 6,654,302 B2 * | 11/2003 | Hashimoto .................... 365/222 |
| 6,707,740 B2 * | 3/2004 | Shinozaki ..................... 365/207 |
| 6,781,901 B2 * | 8/2004 | Shore ............................ 365/201 |
| 6,914,545 B1 * | 7/2005 | Zaidi .............................. 341/59 |
| 7,002,875 B2 * | 2/2006 | Ikeda ............................ 365/222 |
| 7,362,134 B2 * | 4/2008 | Bajkowski et al. ............. 326/46 |
| 2001/0021137 A1 * | 9/2001 | Kai et al. ...................... 365/222 |
| 2003/0002368 A1 * | 1/2003 | Kang et al. .................... 365/201 |
| 2003/0025527 A1 * | 2/2003 | Porter et al. ..................... 326/82 |
| 2003/0039160 A1 * | 2/2003 | Arimoto et al. ................ 365/200 |
| 2003/0098716 A1 * | 5/2003 | Porter et al. ................... 326/105 |
| 2003/0206474 A1 * | 11/2003 | Shore ............................ 365/208 |
| 2006/0239071 A1 * | 10/2006 | Ohta ........................ 365/185.02 |

FOREIGN PATENT DOCUMENTS

| | | | |
|---|---|---|---|
| JP | 2003173684 A | * | 6/2003 |
| JP | 2004032151 A | | 1/2004 |

* cited by examiner

LOGIC CIRCUIT, ADDRESS DECODER CIRCUIT AND SEMICONDUCTOR MEMORY

This application is the National Phase of PCT/JP2007/073909, filed Dec. 12, 2007 which is based upon and claims the benefit of the priority of an earlier Japanese Patent Application No. 2006-334645, filed on Dec. 12, 2006, the disclosure of which is incorporated herein in its entirety by reference thereto.

TECHNICAL FIELD

This invention relates to a semiconductor memory and, more particularly, to an address decoder circuit that may be applied with advantage to a semiconductor memory for high speed access, and to a logic circuit that composes the address decoder circuit.

BACKGROUND ART

FIG. 10 shows a typical configuration of an address decoder circuit of a related technique. In a synchronous memory, a word line signal is converted to a pulsed signal for control. In the example of FIG. 10, four bit address signals AD[0] to AD[3] are decoded to 16 bit word line signals WL[0] to WL[15]. The address signals are decoded on the two-bit basis into four bit selection signals XA1[3:0] and XA2[3:0] and, as AND logic is taken between a reference clock signal CLK0 that determines the pulse width of a word line signal WL, and the signals XA1 [3:0], XA2 [3:0], finally word line signals WL are generated.

To implement the AND logic, a static CMOS NAND gate and an inverter gate are generally used. The transistor ratio of the CMOS gate is determined so that the pulse width will be set at a constant value until the clock signal CLK gets to the signal WL.

In the case of an inverter gate, for example, the ratio of the gate width of a PMOS transistor and that of an NMOS transistor is set to approximately 2:1 and, in the case of a NAND gate, the ratio of the gate width of the PMOS transistor and that of the NMOS transistor is set to 1:1. It is observed that, if a static CMOS gate is used, there is set a limit to increasing the operating speed of the address decoder.

When a pulse signal is propagated through a static CMOS gate, there occurs first the signal propagation for activation, followed by the signal propagation for deactivation. A critical path is a signal propagation path for activation.

A pulse generation circuit used for increasing the operating speed of the CMOS gate, through which a pulse signal is propagated, is disclosed in Patent Document 1 (JP Patent Kokai JP-A-2004-32151). The pulse generation circuit includes:

a gate having a first output transistor that sets an activation level and a second output transistor that sets a deactivation level, a first inverter string made up of a plurality of inverters connected in cascade to propagate a set pulse SET to drive a first output transistor, a second inverter string made up of a plurality of inverters connected in cascade to propagate a reset pulse RESET that controls the deactivation of the output pulse to drive a second output transistor, and a reset transistor provided at an inverter output of the first inverter string. The reset transistor drives a pulse edge of the inverter output corresponding to a trailing edge of the set pulse SET in response to the reset pulse RESET propagated through the second inverter string to prevent delay of a pulse edge corresponding to a trailing side edge of the set pulse SET. With this pulse generating circuit, the part of the transistors that propagate the signal for deactivation is disconnected from the path of propagation of the pulse signal to lower the gate input capacitance to allow for faster propagation of the signal for activation. On the other hand, if the transistor parts are simply disconnected, the signal for deactivation is propagated at a lower speed. Thus, to control the disconnected transistor parts, there are newly provided a signal path for propagating the signal for deactivation using an inverter string and a reset signal RS propagated through the inverter string.

A signal RS has a constant pulse width and rises simultaneously as the falling of the clock signal CLK. This prevents the signal for deactivation from being propagated at a lower speed.

FIG. 11 shows a configuration of an address decoder circuit 410 to which this speed-raising technique has been applied. A signal RS0 for deactivation is newly provided and propagated using an inverter string. In an AND circuit 200 that forms an address decoder circuit 200, a transistor for propagating a signal for deactivation is replaced by two transistors.

The divided transistors are a PMOS transistor for a NAND gate and an NMOS transistor for an inverter gate. The PMOS transistor has a source connected to a power supply, a drain connected to CLKB and a gate connected to RSB. The NMOS transistor has a drain connected to CLK1, a source connected to GND and a gate connected to RS.

One of the two transistors is controlled by a reset signal propagated through the inverter string. This should achieve the high-speed operation of the address decoder circuit.

[Patent Document 1] JP Patent Kokai Publication No. JP-P2004-32151A

SUMMARY

The disclosure of Patent Document 1 is to be incorporated herein by reference. The following is an analysis of the related technique which is by the present invention. The configuration of the above-described related technique is beset with the following difficulties:

The operating speed of the address decoder circuit, explained above with reference to FIG. 10, cannot be increased beyond a certain limit value.

With the address decoder circuit, explained with reference to FIG. 11, the power consumption is increased. In the high speed system, shown in FIG. 11, reset control is carried out even for non-operating gates. Because gate operation rate is low, the address decoder suffers significant power consumption due to wasteful reset control.

The present invention seeks to solve one or more of the above mentioned problems.

The invention disclosed in the present invention may be summarized as follows:

A logic circuit according to the present invention comprises a first NAND gate that receives a first pulse signal and a first selection signal to output an inverted version of a logical product of the two input signals, a first inverter gate that receives and inverts an output signal of the first NAND gate to output a resulting signal, a second NAND gate that receives a second pulse signal and the first selection signal to output an inverted version of a logical product of the two input signals, a second inverter gate that inverts an output signal of the second NAND gate to output a resulting signal, a first PMOS transistor that has a drain connected to an output of the first NAND gate, has a gate connected to an output of the second NAND gate and has a source connected to a power supply voltage, and a first NMOS transistor that has a gate connected to an output of the first inverter gate, has a gate connected to an output of the second inverter gate and has a source connected to a ground potential. According to the present invention, a logical product of the first pulse signal and the first selection signal is output at the first output terminal, while a logical output of the second pulse signal and the first selection signal is output at the second output terminal.

With the logic circuit according to the present invention, the first pulse signal is brought to a power supply potential on activation and is brought to the ground potential after a preset time. The second pulse signal is activated to the power supply potential at the same time as the first pulse signal is brought to the ground potential. The second pulse signal is set to the ground potential after a preset time. In case the first selection signal is activated, the first selection signal is set to the power supply potential before activation of the first pulse signal. The first selection signal is kept at the power supply potential until the second pulse signal is activated and subsequently transitions to the ground potential. In case the first selection signal is not activated, the first selection signal is set at the ground potential before the first pulse signal is activated. The first selection signal is kept at the ground potential until the second pulse signal is activated and subsequently transitions to the ground potential.

According to the present invention, in case the first selection signal is activated, a third pulse signal is output from the first inverter gate after a preset time in synchronization with the first pulse signal. A fourth pulse signal is output from the second inverter gate after a preset time in synchronization with the second pulse signal.

A logic circuit according to the present invention comprises a first NAND gate that receives a first pulse signal and a first selection signal to output an inverted version of a logical product of the two input signals, a first inverter gate that inverts an output signal of the first NAND gate to output a resulting signal, a latch circuit that receives a second pulse signal and that latches an inverted version of the second pulse signal in response to an output signal of the first inverter gate, a second inverter gate that inverts an output signal of the latch circuit to output a resulting signal, a first PMOS transistor that has a drain connected to an output of the first NAND gate, has a gate connected to an output of the latch circuit and has a source connected to a power supply voltage, and a first NMOS transistor that has a drain connected to an output of the first inverter gate, has a gate connected to an output of the second inverter gate and has a source connected to a ground potential.

With the logic circuit according to the present invention, the latch circuit includes a third inverter gate that inverts an output signal of the first inverter gate, a third NAND gate, a first input of which inputs the second pulse signal, and a fourth NAND gate that receives an output signal of the third inverter gate and an output signal of the third NAND gate. An output of the fourth NAND gate is connected to a second input of the third NAND gate.

According to the present invention, the first pulse signal is brought to a power supply potential on activation and is brought to the ground potential after a preset time. The second pulse signal is activated at the same time as the first pulse signal is brought to the ground potential. The second pulse signal is set at the ground potential after a preset time. When the first selection signal is activated, the first selection signal is set at the power supply potential before activation of the first pulse signal. The first selection signal is kept at the power supply potential until the first pulse signal is activated and subsequently transitions to the ground potential. If the first selection signal is not activated, the first selection signal is brought to the ground potential before the first pulse signal is activated. The first selection signal is kept at the ground potential until the first pulse signal is activated and transitions to the ground potential.

According to the present invention, if the first selection signal is activated, a third pulse signal is output from the first inverter gate after a preset time in synchronization with the first pulse signal. A fourth pulse signal is output from the second inverter gate after a preset time in synchronization with the second pulse signal.

According to the present invention, the size of the PMOS transistor that composes the first NAND gate is set so as to be less than or equal to the size of the first PMOS transistor, while the size of the NMOS transistor that composes the first inverter gate is set so as to be less than or equal to the size of the first NMOS transistor. It is thus possible to provide for a shorter delay time as from activation of the first pulse signal until activation of the third pulse signal.

An address decoder circuit according to the present invention comprises an array of a plurality of logic circuits as defined above.

According to the present invention, the fourth pulse signal may not be output from the last stage logic circuit of the multiple logic circuits.

A logic circuit according to the present invention comprises a first circuit that takes an inverted version of a logical product of a first signal supplied to a first input terminal and a second signal supplied to a second input terminal, a second circuit that receives an output signal of the first circuit to output an inverted version of the output signal at a first output terminal, a third circuit that takes an inverted version of a logical product of the second signal supplied to the second input terminal and a third signal supplied to a third input terminal, a fourth circuit that receives an output signal of the third circuit to output a signal which is an inverted version of the output signal at a second output terminal, a first switch element connected between an output of the first circuit and a first power supply, wherein the first switch element is controlled to be on or off based on an output of the third circuit, and a second switch element connected between an output of the second circuit and a second power supply, wherein the second switch element is controlled on or off based on an output of the fourth circuit.

According to the present invention, a latch circuit may be provided in place of the third circuit. The latch circuit latches the signal supplied to the third input terminal in response to an output of the second circuit. That is, a logic circuit according to the present invention may comprise a first circuit that takes an inverted version of a logical product of a first signal supplied to a first input terminal and a second signal supplied to a second input terminal, a second circuit that receives an output signal of the first circuit to output an inverted version of the output signal at a first output terminal, a third circuit that latches an input signal supplied to a third input terminal in response to an output of the second circuit, a fourth circuit that receives an output signal of the third circuit to output a signal which is an inverted version of the output signal at a second output terminal, a first switch element connected between an output of the first circuit and a first power supply and turned on or off based on an output of the third circuit; and a second switch element connected between an output of the second circuit and a second power supply and turned on or off based on an output of the fourth circuit.

An address decoder circuit according to the present invention may comprise a pre-decoder that pre-decodes a preset group of bits (m bits) of an address signal to activate one of output $2^m$ bits, where ^ denotes a power, and a first set of a $2^m$ number of juxtaposed logic circuits. The address decoder may also comprise another pre-decoder that pre-decodes another group of bits (n bits, n being a number equal to or different from m) of the address signal to activate one of output $2^n$ bits, and a second set of a $2^m$-number of juxtaposed logic circuits placed as a next stage of the logic circuits of the first set. The logic circuits of the first set and the logic circuits of the second set are the logic circuits according to the present invention. The logic circuits of the first group each input a clock pulse at the first input terminal and a reset pulse at the third input terminal. To the second terminal is coupled a corresponding bit of an output of the pre-coder. The logic circuits of the first group each output a clock pulse at the first output terminal and output a reset pulse at the second output terminal. The logic circuits of the second group each input, at each first input terminal, in common, the clock pulse output from the first output terminal of a corresponding one of the logic circuits of the first group. The logic circuits of the second group each input, at each third input terminal, in common, the reset pulse output from the second output terminal of a corresponding one of the logic circuits of the first group. The logic circuits of the second group each receive, at each second input terminal, a corresponding bit of an output of the other pre-decoder. The logic circuits of the second group each output the clock pulse at each first output terminal and output the reset pulse at each second output terminal. The last stage logic circuit of the second group outputs a clock pulse at each first output terminal. The signal supplied to the second input terminal of each logic circuit is an enabling signal. The clock pulse is activated during the period of activation of the enabling signal. The reset pulse is activated in synchronization with the end of the clock pulse.

In the address decoder circuit, including a plurality of logic circuits, according to the present invention, reset control is managed, with the use of the second pulse signal, only for the logic circuit that has been selected and run in operation. Thus, in comparison with the conventional address decoder circuit, wasteful charging/discharging may be avoided such that aggregate power consumption may be reduced at the same time as a high operating speed is not compromised.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

Figure 1:
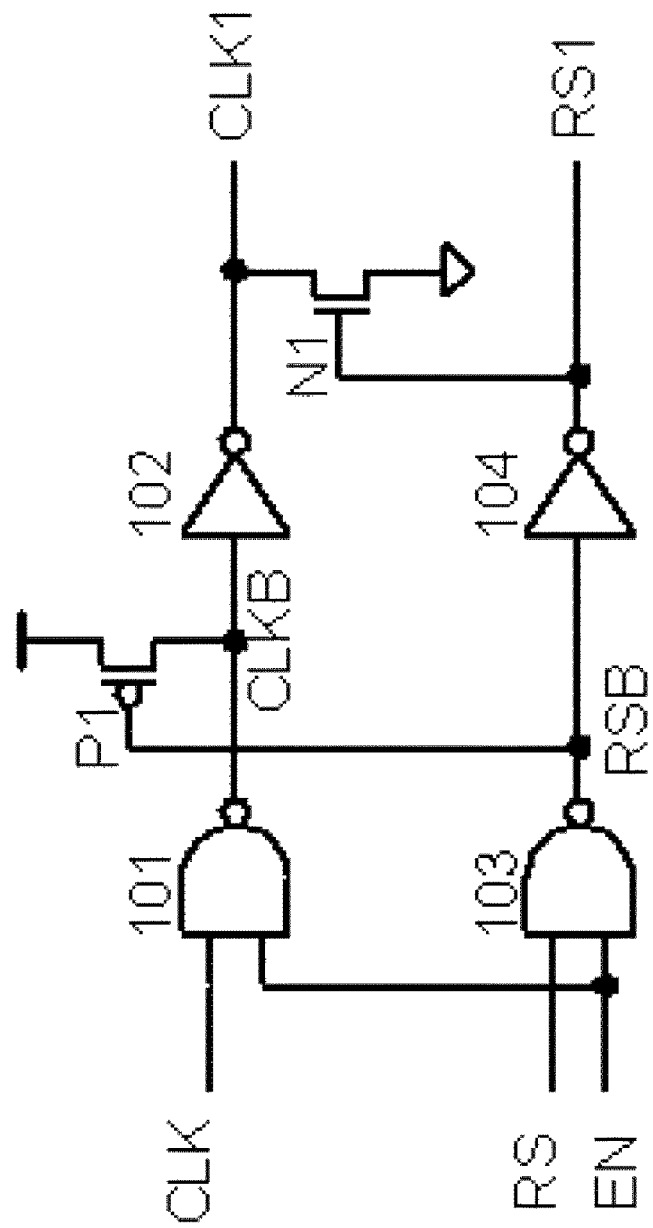
FIG. 1 is a circuit diagram showing a configuration of Example 1 of the present invention.

Preferred modes for carrying out the present invention will now be described. An address decoder circuit according to an exemplary embodiment of the present invention includes a plurality of logic circuits. Each logic circuit includes:

a first NAND gate (101) that receives a first pulse signal (CLK) and a first selection signal (EN) as inputs to output an inverted version of a logical product of the two input signals, a first inverter gate (102) that inverts an output signal of the first NAND gate to output a resulting signal, a second NAND gate (103) that receives a second pulse signal (RS) and the first selection signal (EN) as inputs to output an inverted version of a logical product of the two input signals, a second inverter gate (104) that inverts an output signal of the second NAND gate to output a resulting signal, a first PMOS transistor (P1) that has a drain connected to an output of the first NAND gate, has a gate connected to an output of the second NAND gate and has a source connected to a power supply voltage, and a first NMOS transistor (N1) that has a drain connected to an output of the first inverter gate (102), has a gate connected to an output of the second inverter gate (104) and has a source connected to a ground potential. Since only the logic circuit which has being in operation is caused to be reset controlled using the second pulse signal, wasteful charging/discharging may be avoided such that power consumption may be reduced and at the same time high speed operation may be attained.

A logic circuit according to another exemplary embodiment of the present invention may include a first NAND gate (101) that receives a first pulse signal and a first selection signal to output an inverted version of a logical product of the two input signals, a first inverter gate (102) that inverts an output signal of the first NAND gate to output a resulting signal, a latch circuit (201) that receives a second pulse signal and that latches an inverted version of the second pulse signal in response to an output signal of the first inverter gate, a second inverter gate (104) that inverts an output signal of the latch circuit to output a resulting signal, a first PMOS transistor (P1) that has a drain connected to an output of the first NAND gate, has a gate connected to an output of the latch circuit and has a source connected to a power supply voltage, a first NMOS transistor (N1) that has a drain connected to an output of the first inverter gate, has a gate connected to an output of the second inverter gate and has a source connected to a ground potential. The exemplary embodiments will be described in the below.

Exemplary Embodiment 1

FIG. 1 shows the configuration of a first exemplary embodiment of the present invention. A logic circuit of the present exemplary embodiment operates as an AND circuit. Referring to FIG. 1, the AND circuit of the present exemplary embodiment includes a two-input AND circuit 101 that receives a clock signal CLK and a selection signal (enabling signal) EN and that produces a signal CLKB, an inverter gate 102 that receives the signal CLKB to output a signal CLK1, a two-input NAND circuit 103 that receives a signal (reset signal) RS and a signal EN and that produces a signal RSB, an inverter gate 104 that receives the signal RSB and that produces a signal RS1 at an output terminal, a PMOS transistor P1 that has a source and a drain respectively connected to a power supply and to an output of the two-input AND circuit 101 and that receives the signal RSB at its gate to control the rising of the signal CLKB, and an NMOS transistor N1 that has a source and a drain respectively connected to GND and to an output of the inverter gate 102 and that receives the signal RS1 at its gate to control the falling of the signal CLK1. The logic operation is such that

CLK1=INV (NAND(CLK, EN))=AND(CLK, EN),
RS1=INV(NAND(RS, EN)=AND (RS, EN).

Figure 2:
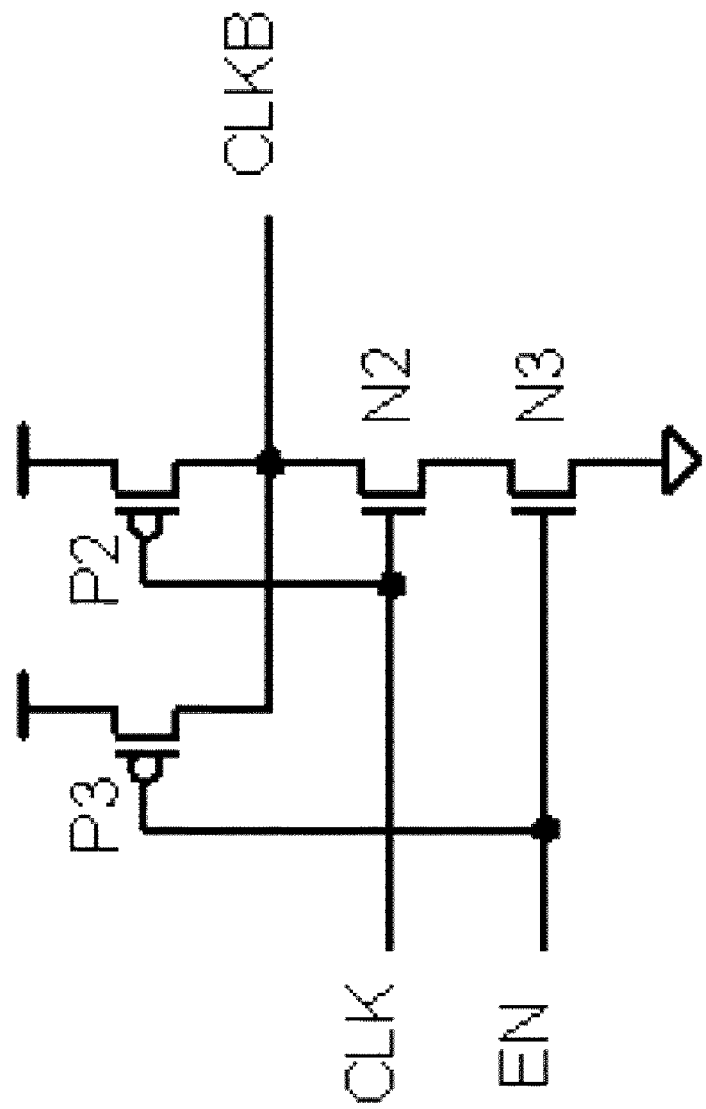
FIG. 2 is a circuit diagram showing a configuration of a NAND circuit of FIG. 1.

FIG. 2 shows the configuration of the two-input AND circuit 101. Referring to FIG. 2, the two-input AND circuit 101 includes, similarly to a commonly used CMOS NAND gate, two PMOS transistors P2 and P3 and two NMOS transistors N2 and N3. The PMOS transistors P2 and P3 have sources connected in common to a power supply. To the gates of these PMOS transistors P2 and P3, there are respectively supplied the clock signal CLK and the selection signal EN. The NMOS transistors N2 and N3 are connected in series between coupled drains of the PMOS transistors P and, P3 and the ground GND. To the gates of these NMOS transistors N2 and N3, there are respectively supplied the clock signal CLK and the selection signal EN. The size of the PMOS transistor P2, supplied with the clock signal CLK, is set so as to be smaller than its normal size. For example, the size of the PMOS transistor P2 is one-half to one-fourth of that of the normal NAND PMOS transistor.

Figure 3:
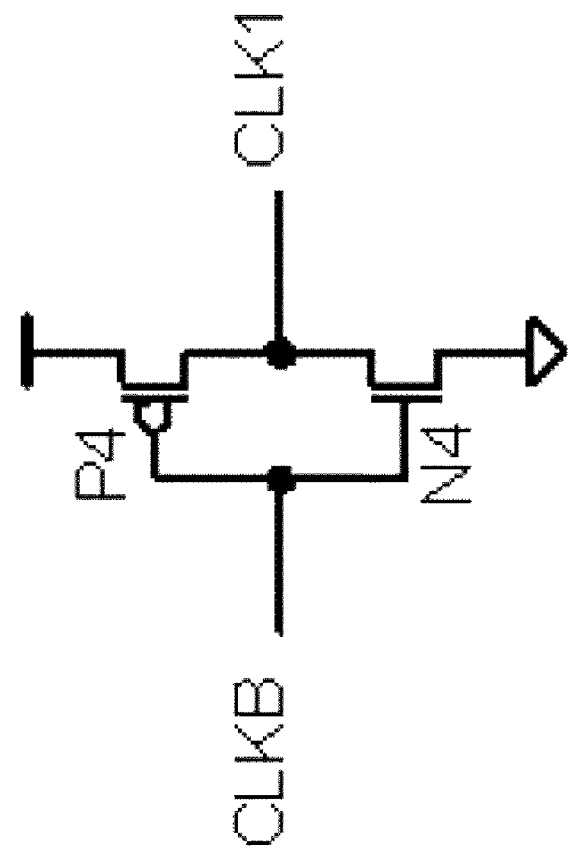
FIG. 3 is a circuit diagram showing a configuration of an inverter gate of FIG. 1.

FIG. 3 shows the configuration of the inverter gate 102 of FIG. 1. Similarly to the commonly used CMOS inverter gate, the inverter gate 102 includes a PMOS transistor P4 and an NMOS transistor N4. The transistors P4 and N4 have sources respectively connected to a power supply and to the ground GND, while having drains connected together and connected to an output terminal and having gates connected together and connected to an input terminal. The size of the NMOS transistor N4 is selected to be smaller than the value of the standard CMOS inverter gate, for example, to be one-half to one-fourth of that of the normal size.

Figure 4:
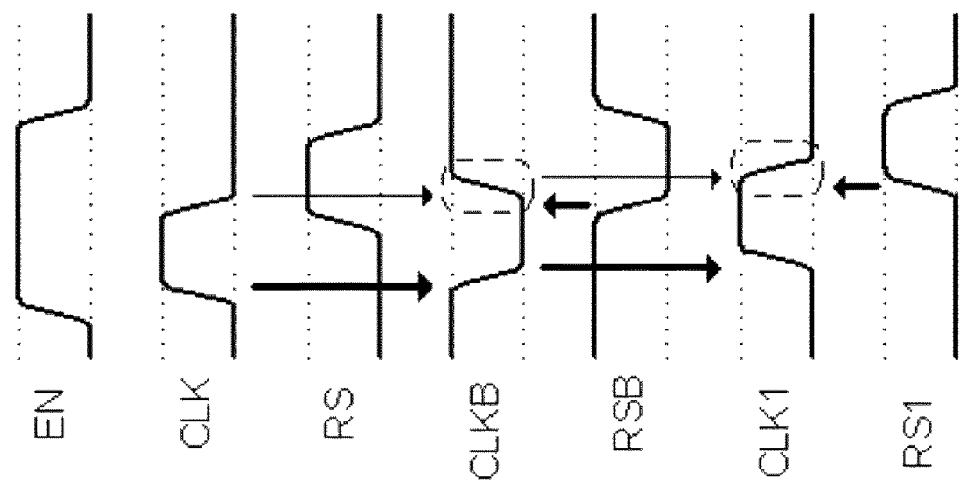
FIG. 4 is a timing waveform diagram for illustrating the operation of an Example 1 of the present invention.

FIG. 4 is a timing waveform diagram for illustrating the operation of the AND circuit of FIG. 1. The clock signal CLK is a pulse signal that goes HIGH during a preset time interval.

The reset signal RS is a pulse signal that rises in synchronization with the rising of the clock signal CLK.

The selection signal EN has its value set before the rising edge of the clock signal CLK. This value is maintained until after the falling edge of the signal RS.

The rising edge of the clock signal CLK comes in after the selection signal EN is set at HIGH. The NAND gate 101 thus pulls down the signal CLKB to a LOW level. In the inverter gate 102, driven by the NAND gate 101, the NMOS transistor N4 (see FIG. 3) has a size smaller than that with the standard CMOS inverter to allow for faster falling of the signal CLKB.

The signal CLKB then falls, whereby the inverter gate 102, receiving the CLKB, pulls up the clock signal CLK1, coupled to its output, to a HIGH level. At this time, the inverter gate 102 drives the NAND gate 101 of the next stage AND circuit, not shown.

In the NAND gate 101 of the next stage AND circuit, the size of the PMOS transistor P2 is set so as to be smaller than that in the standard CMOS NAND gate, and hence the clock signal CLK1 may rise at a higher speed.

After a certain time interval, the falling edge of the clock signal CLK comes in, whereby the NAND gate 101 pulls up its output signal CLKB. At the same time, the rising edge of the signal RS comes in as input. The NAND gate 103, receiving the signal RS, pulls down the signal RPB connected to its output.

When the signal RSB has become LOW in this manner, the PMOS transistor P1 is turned on to pull up the signal CLKB, which is connected to the drain terminal of the PMOS transistor P1, towards a HIGH level.

Since the AND circuit 101 and the PMOS transistor P1 pull up the signal CLKB simultaneously, the signal CLKB may rise at an elevated speed.

The signal CLKB then rises to HIGH, so that the inverter gate 102 pulls down the clock signal CLK1, which is connected to the output of the inverter gate 102. Simultaneously, the signal RSB falls to LOW, and hence the inverter gate 104, receiving the signal RSB, pulls the signal RS1, which is connected to the output of the inverter gate 104, to a HIGH side.

This turns on the NMOS transistor N1 to pull the clock signal CLK1 to LOW.

Since the inverter gate 102 and the NMOS transistor N1 simultaneously pull down the clock signal CLK1 to LOW side, the clock signal CLK1 falls at an elevated speed.

After a certain time interval, the falling edge of the signal RS comes in as input. This causes the NAND circuit 103 to pull up the signal RSB to turn off the PMOS transistor P1. At this time, the clock signal CLK is LOW, so that the PMOS transistor P2 of the NAND gate 101 (see FIG. 2) is turned on. The signal CLKB is kept HIGH, even if the PMOS transistor P1 has been turned off.

The signal RSB then rises to cause the inverter gate 104 to pull down the signal RS1 to turn off the NMOS transistor N1.

The signal CLKB is HIGH at this time so that the inverter gate 102 outputs LOW. There is thus caused no problem even if the NMOS transistor N1 has been turned off. The selection signal EN is kept HIGH until after the falling edge of the signal RS.

Figure 5:
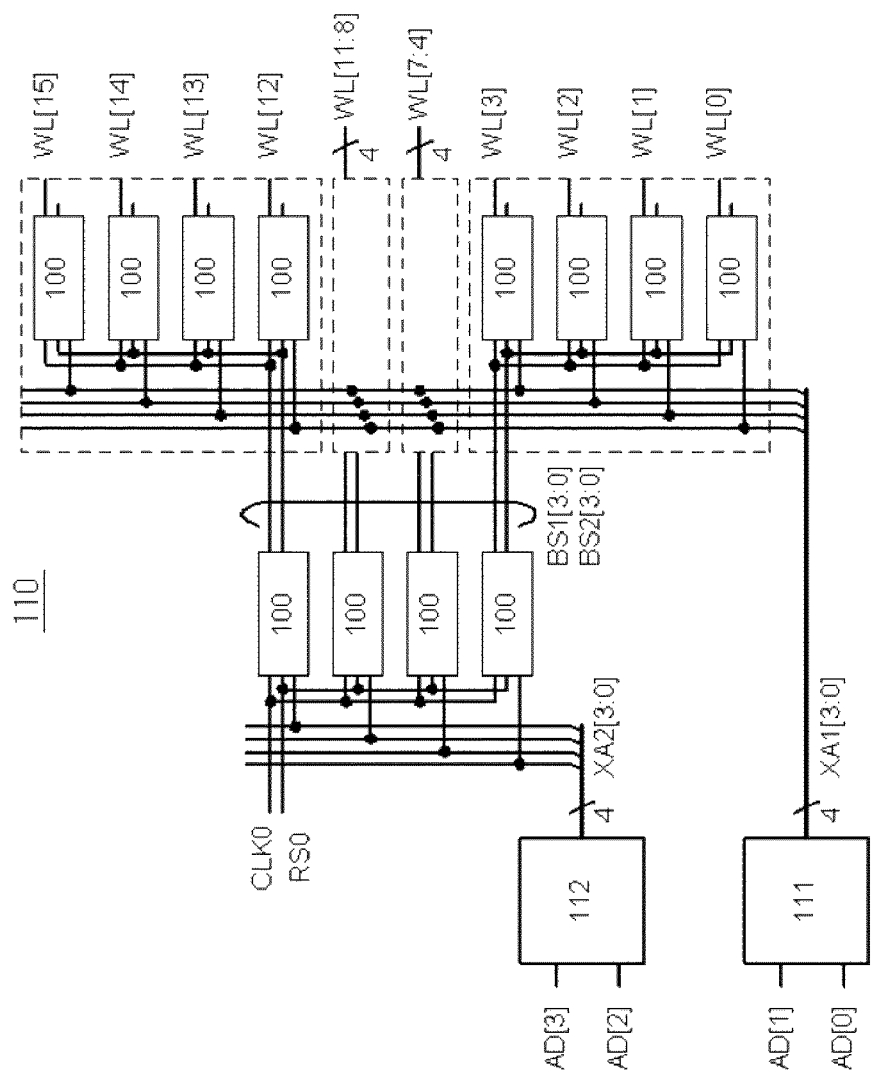
FIG. 5 is a circuit diagram showing a configuration of an address decoder of Example 1 of the present invention.

FIG. 5 is a diagram illustrating the configuration of an address decoder circuit of the present exemplary embodiment. Referring to FIG. 5, an address decoder circuit 110 includes pre-decoders 111 and 112 and an AND circuit 100 according to the present invention.

The address decoder circuit receives an N-bit address signal AD, a reference clock signal CLK0 that determines the pulse width of a word line, and a reset signal RS0, to output a signal of approximately the same pulse width as the clock signal CLK0 at a word line as selected by the address signal. It is observed that the reset signal RS0 rises in synchronization with the falling edge of the clock signal CLK0.

In the exemplary embodiment of FIG. 5, four bit address signals AD[0] to AD[3] are decoded by the pre-decoders 111 and 112, on the two-bit basis, so that four bit selection signals XA1[3:0] and XA2[3:0] are output. One of four bits of the selection signal XA2 [3:0] from the pre-decoder 112 is brought HIGH, so that, out of the AND circuits 100, the inputs of which are connected to XA2[3:0], the AND circuit coupled to the HIGH bit is selected. On the other hand, one of four bits of the selection signal A1 [3:0] from the pre-decoder 111 is brought HIGH, so that, out of the AND circuits 100, the inputs of which are connected to XA1[3:0], the AND circuit coupled to the HIGH bit is selected.

Out of the four AND circuits 100, receiving the four bit selection signal A2 [3:0], only the selected AND circuit 100 causes the pulse clock signal CLK0 and the reset RS0 to be propagated as signals BS1 and BS2 to the next stage.

The values of the four bit selections signals A2[3:0], output by the pre-decoder 112, are set before the rising edge of the clock signal CLK0. These signal values are kept until after the falling edge of the signal RS0.

Out of the 16 AND circuits 100, supplied with four bit pulse signals BS1 [3:0] and BS2 [3:0] and with four bit selection signals XA1[3:0], only the selected sole AND circuit 100 causes the pulse signal BS1[3:0] to be propagated to the word line WL. The values of the four bit selections signals A1[3:0], output by the pre-decoder 111, are set before the rising edge of the signal BS1[3:0]. These signal values are kept until after the falling edge of the signal BS2.

With the last stage AND circuit 100, there is no necessity of outputting the reset pulse RS1, so that the inverter 104 may be reduced in size.

In the address decoder of FIG. 5, the address is of four bits (AD [3:0]), and there are two pre-decoders 111 and 112. However, the present invention is not limited to this configuration. The number of the pre-decoders, the number of the AND circuits 100 or the number of the stages is increased with increase in the number of address bits, for instance.

Figure 6:
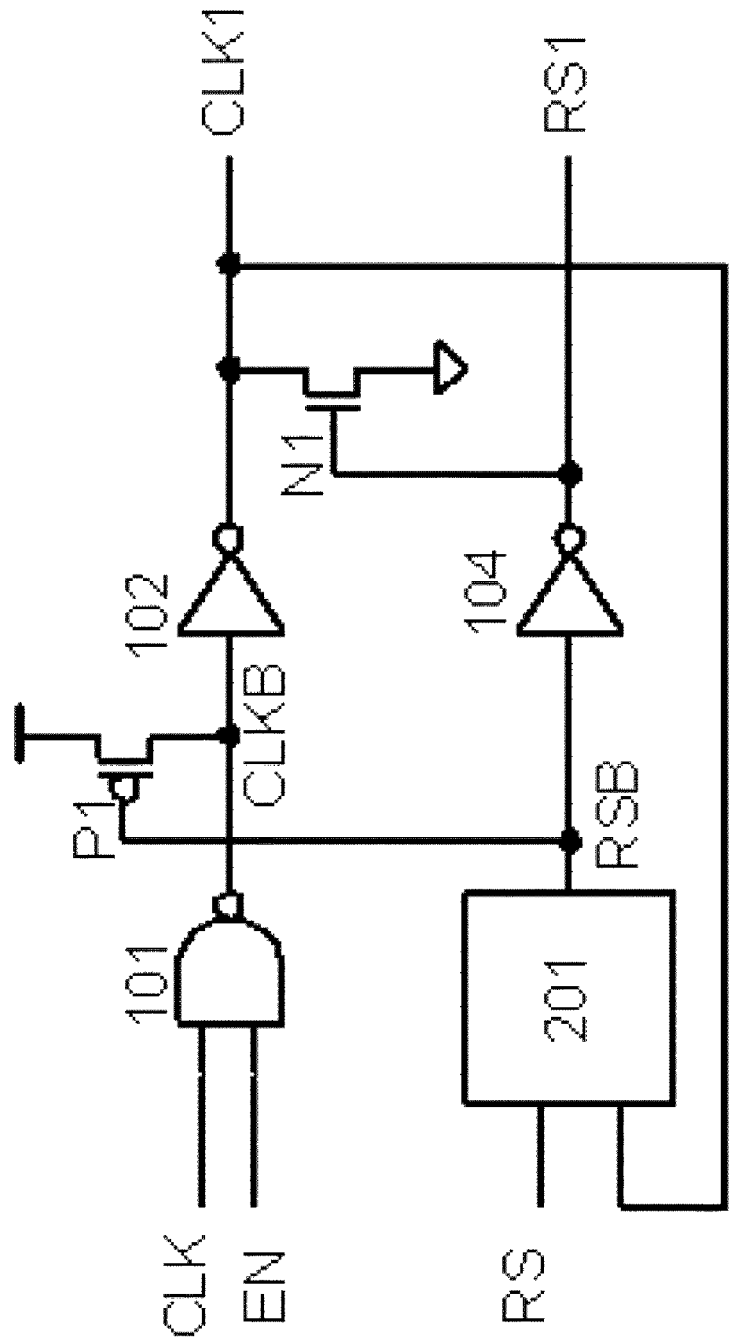
FIG. 6 is a circuit diagram showing a configuration of Example 2 of the present invention.

FIG. 6 shows the formulation of exemplary embodiment 2 of the present invention. The logic circuit of the present exemplary embodiment operates as an AND circuit. Referring to FIG. 6, the AND circuit of the present exemplary embodiment includes a two-input NAND gate 101 that receives a clock signal CLK and a selection signal (enable signal) EN to output a signal CLKB, and an inverter gate 102 that receives the signal CLKB to output a signal CLK1. The AND circuit also includes a latch circuit 201 that receives a signal RS and the clock signal CLK1 and that outputs a signal RSB, and an inverter gate 104 that receives the signal RSB and that outputs the signal RS1. The AND circuit also includes a PMOS transistor P1 that has a source and a drain respectively connected to a power supply and to an output of the NAND gate 101 and that receives the signal RSB at its gate to control the rising of the signal CLKB. The AND circuit further includes an NMOS transistor N1 that has a source and a drain respectively connected to GND and to an output of the inverter gate 102 and that receives the output of the inverter gate 104 at its gate to control the falling of the signal CLK1.

Figure 7:
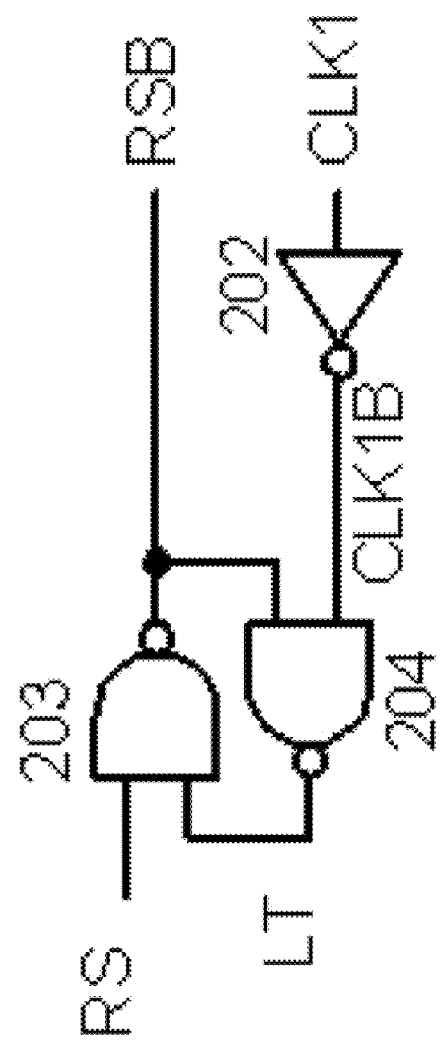
FIG. 7 is a circuit diagram showing a configuration of a latch circuit of FIG. 6.

FIG. 7 shows an example configuration of the latch circuit 201 of FIG. 6. Referring to FIG. 7, the latch circuit includes an inverter gate 202 and NAND gates 203 and 204. The inverter gate 202 inverts the clock signal CLK1 to output a signal CLKB1. The NAND gate 203 receives a signal (reset signal) RS and a signal (latch signal) LT to output a signal RSB, while the NAND gate 204 receives the signal RSB and the clock signal CLK1B to output the signal LT.

Figure 8:
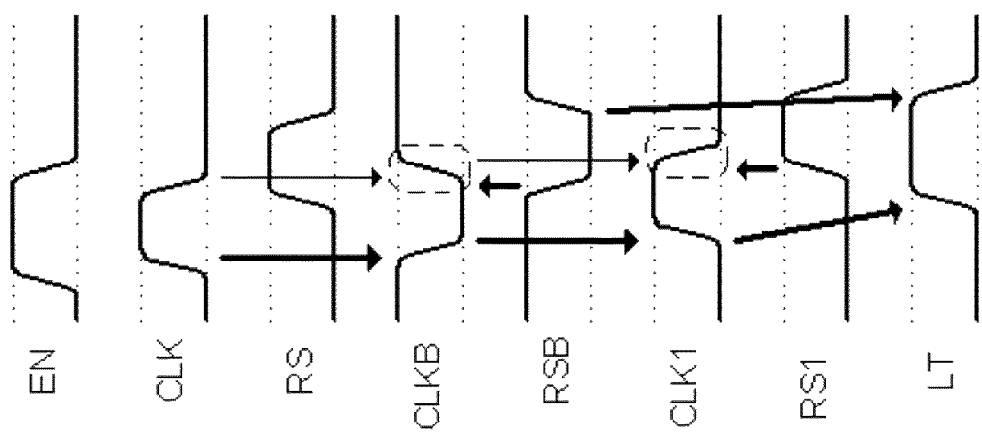
FIG. 8 is a timing waveform diagram for illustrating the operation of an Example 2 of the present invention.

FIG. 8 is a timing waveform diagram for illustrating the operation of the AND circuit of the present exemplary embodiment, explained with reference to FIGS. 6 and 7. The clock signal CLK is a pulse signal that goes HIGH during a preset time interval. The signal (reset signal) RS is a pulse signal that rises in synchronization with the falling of the clock signal CLK. The selection signal EN has its value set before the rising edge of the clock signal CLK to hold the value thus set until after the falling edge of the clock signal CLK.

After the selection signal EN has been set to HIGH, the rising edge of the clock signal CLK is received. The NAND gate 101 thus pulls down the signal CLKB. It is observed that the NMOS transistor N4 of the inverter gate 102, driven by the NAND gate 101, has its size set to a value smaller than that of a commonly used CMOS inverter. Hence, the signal CLKB is allowed to fall at an elevated speed.

The signal CLKB then falls to cause the inverter gate 102 to pull up the clock signal CLK1. At this time, the inverter gate 102 drives the NAND gate 101 of the AND circuit 200 of the next stage. It is observed that the PMOS transistor P2 of the inverter gate 101, driven by the NAND gate 101, has its size set to a value smaller than with the routine CMOS NAND gate, thus allowing for faster rising of the signal CLK1.

With rising of the clock signal CLK1, the signal LT in the latch circuit 201 is set to HIGH level. After a certain time interval, the falling edge of the clock signal CLK is received to cause the NAND gate 101 to pull the signal CLKB to HIGH level. At the same time, the rising edge of the signal RS is received to cause the NAND gate 203 in the latch circuit 201 to pull down the signal RSB to LOW level. This turns on the PMOS transistor P1 to pull up the signal CLKB to HIGH level. The NAND gate 101 and the PMOS transistor P1 perform the pull-up operation simultaneously, thus allowing for faster rising of the signal CLKB.

The signal CLKB then rises to cause the inverter gate 102 to pull down the clock signal CLK1 to LOW level. The signal RSB falls simultaneously to cause the inverter gate 104 to pull up the signal RS1 to HIGH level. This turns on the NMOS transistor N1 to pull down the clock signal CLK1 to LOW level.

The inverter gate 102 and the NMOS transistor N1 perform the pull-down operation simultaneously to allow for faster falling of the clock signal CLK1.

The selection signal EN is kept at HIGH level until after the falling edge of the clock signal CLK.

After a preset time interval, the falling edge of the signal RS is received to cause the NAND gate 203 to pull up the signal RSB to HIGH level to turn off the PMOS transistor P1. The clock signal CLK is LOW at this time so that the PMOS transistor P2 in the AND circuit 101 is turned on. The signal CLKB is thus kept HIGH even if the PMOS transistor P1 has been turned off.

The signal RSB then rises to cause the inverter gate 104 to pull down the signal RS1 to LOW to turn off the NMOS transistor N1.

At this time, the signal CLKB is HIGH and the inverter gate 102 outputs LOW. Hence, there is presented no problem even if the NMOS transistor N1 is turned off. With rising of the signal RSB, the signal LT in the latch circuit 201 is reset to LOW.

Figure 9:
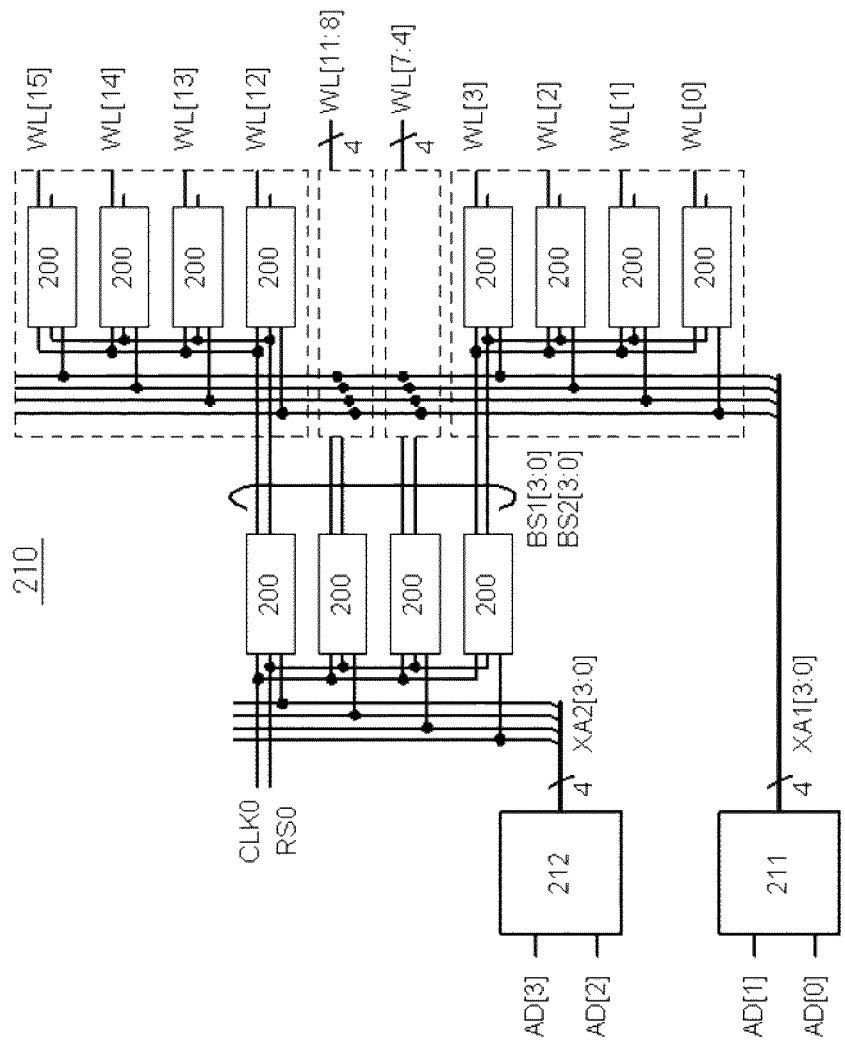
FIG. 9 is a circuit diagram showing a configuration of an address decoder of Example 2 of the present invention.

FIG. 9 shows an example configuration of the address decoder circuit according to the present exemplary embodiment. Referring to FIG. 9, an address decoder circuit 210 includes pre-decoders 211 and 212, and an AND circuit 200. The address decoder circuit receives an N-bit address signal AD, a reference clock signal CLK0 that determines the pulse width of the word line, and a reset signal RS0 that rises in synchronization with the falling edge of the clock signal CLK0, to output a signal of approximately the same pulse width as the clock signal CLK0 on the word line selected by the address signal.

In the example of FIG. 9, the four bit address signals AD[0] to AD[3] are decoded on the two-bit basis, by the pre-decoders 211, 212, to output four bit selection signals XA1[3:0] and XA2[3:0]. Out of the four AND circuits 200, to each of which the four bit selection signal XA2[3:0] is supplied, only the sole AND circuit 200 selected allows a pulse clock signal CLK0 and a signal RS0 to be propagated to the next stage as the signal BS1[3:0] and the signal BS2[3:0]. It is observed that the value of the signal XA2[3:0] is set before the rising edge of the clock signal CLK0 and is kept until after the falling edge of the clock signal CLK0.

Out of the 16 AND circuits 200, which receive four bit pulse signals BS1[3:0] and BS2[3:0] and four bit selection signal XA[3:0], only the sole AND circuit 200 selected allows the pulse signal BS1 to be propagated to the word line WL.

It is observed that the signal XA1[3:0], output by the pre-decoder 211 is settled before the rising edge of the signal BS1, and is kept until after the falling edge of the signal BS2. With the last stage AND circuit 200, it is unnecessary to output the reset pulse RS1, thus allowing for reducing the size of the inverter 104.

Figure 10:
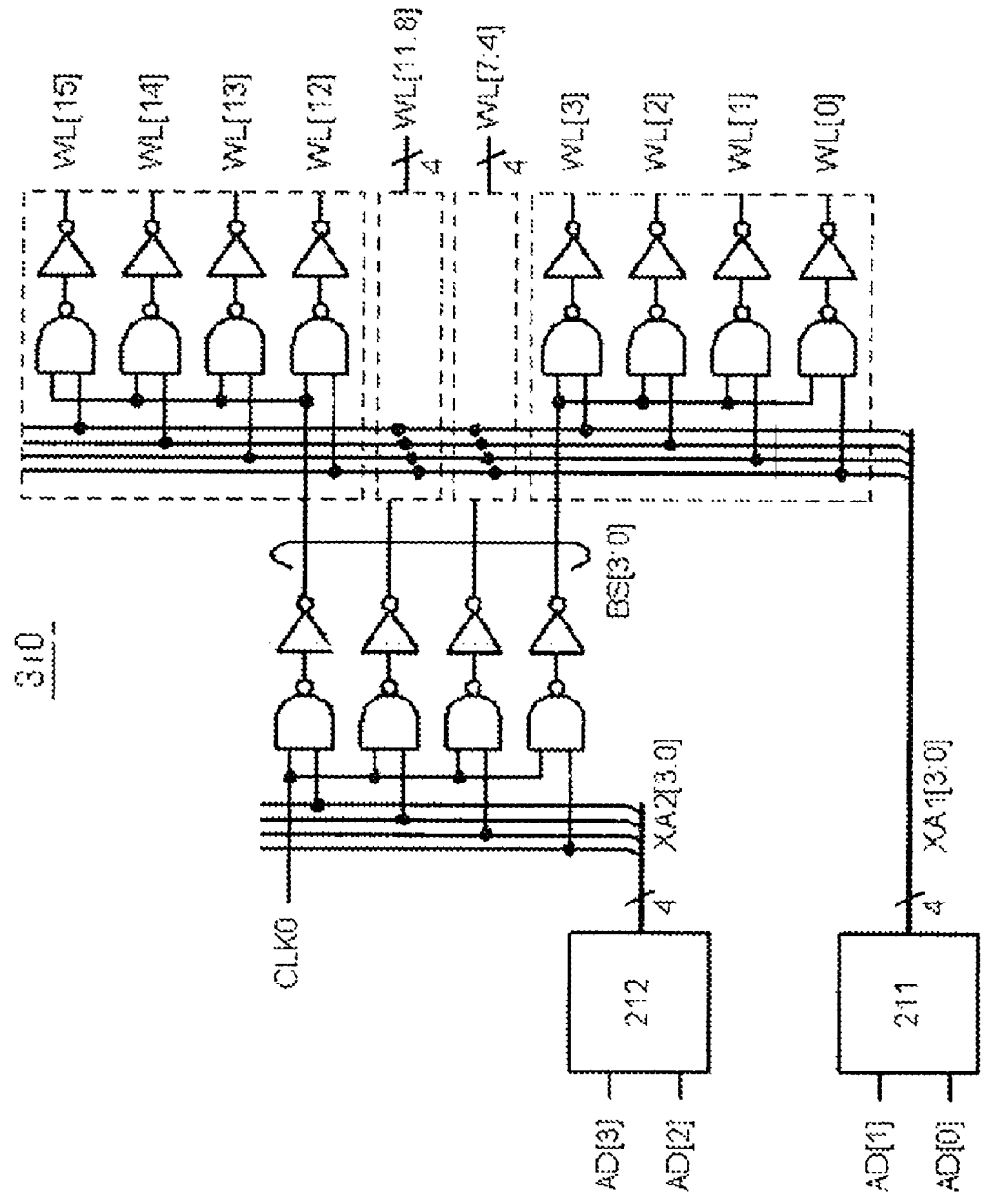
FIG. 10 is a circuit diagram showing a configuration of a conventional address decoder.

By configuring the address decoder circuit with the use of the AND circuits of the present exemplary embodiment, it is possible to increase the operating speed by 30% in comparison with the address decoder circuit of the related art shown in FIG. 10.

Figure 11:
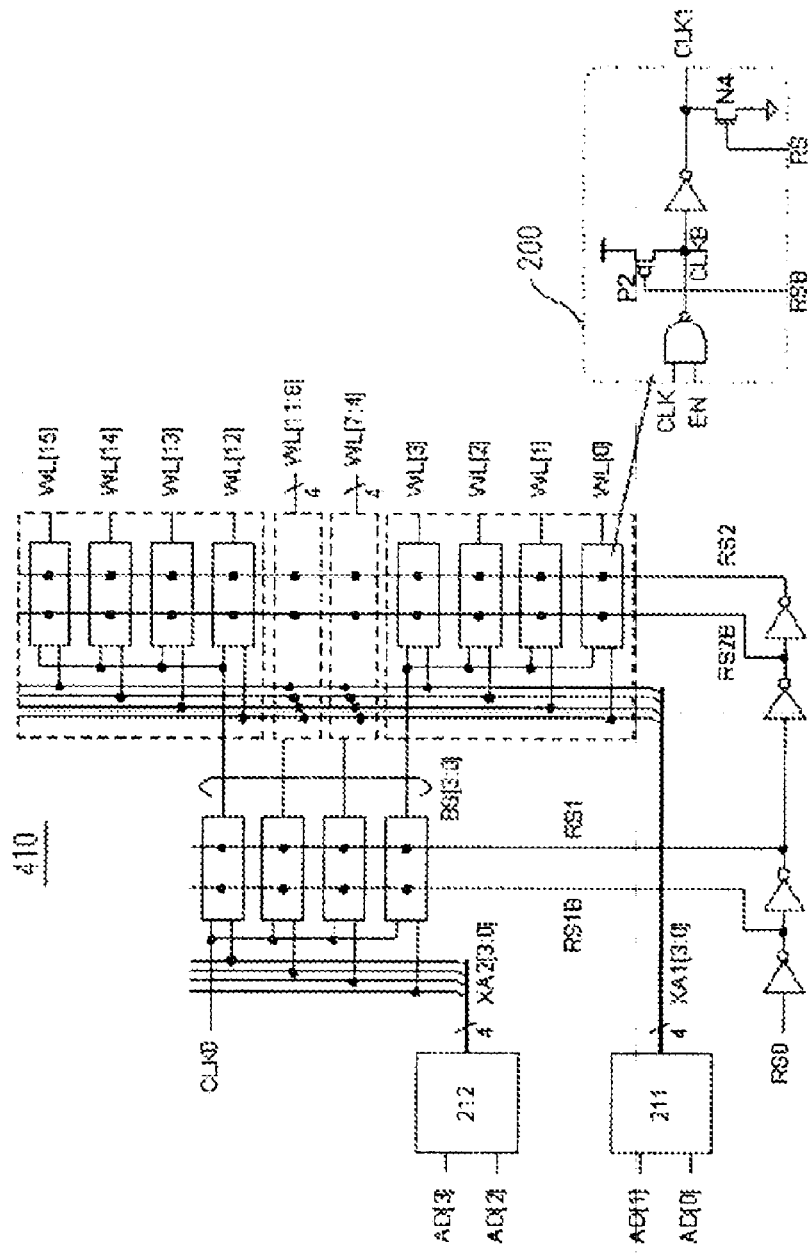
FIG. 11 is a circuit diagram showing a configuration of a conventional address decoder.

The power consumption of the present address decoder circuit at the time of the resetting operation is now compared with that of the address decoder circuit of the related art shown in FIG. 11.

In case of implementation with the fan-out of the order of 4, the input capacitance of the NAND gate of the first stage AND circuit is 1. The input capacitance of the PMOS transistor P2 is 1, that of the inverter gate is 6, and that of the NMOS transistor N4 is 2.

In the second stage AND circuit, the input capacitance of the NAND gate is 4 and that of the PMOS transistor P2 is 4. The input capacitance of the inverter gate is 24, while that of the NMOS transistor N4 is 8.

The input capacitances of four inverters of the inverter string are 4, 8, 24 and 32.

The transistor capacitances, charged and discharged by propagation of the signal RS0 of the clock signal CLK0, are

CLK0: (1+6)+(4×4+24)=47

RS0: (1+2)×4+(4+8)×16+4+8+24+32=272

The total is 319.

On the other hand, if the address decoder circuit is configured using the AND circuit of the present invention, the transistor capacitances are

CLK0: (1+6)+(4×4+24)=47

RS0: (1+2)×1+(4+8)×1+4+8/4+24/4+32/16=29

The total is 76, thus indicating that the transistor capacitances, charged or discharged at the time of resetting, may be significantly reduced. The difference becomes larger with increase in the number of addresses.

It will be appreciated that the particular exemplary embodiments or examples may be modified or adjusted within the gamut of the entire disclosure of the present invention, inclusive of claims, based on the fundamental technical concept of the invention. Further, variegated combinations or selection of elements disclosed herein may be made within the framework of the claims. That is, the present invention may encompass various modifications or corrections that may occur to those skilled in the art in accordance with the within the gamut of the entire disclosure of the present invention, inclusive of claim and the technical concept of the present invention.

What is claimed is:

1. A logic circuit comprising:
a first NAND gate that receives a first pulse signal and a first selection signal as inputs to output an inverted version of a logical product of the two input signals;
a first inverter gate that inverts an output signal of the first NAND gate to output a resulting signal;
a second NAND gate that receives a second pulse signal and the first selection signal as inputs to output an inverted version of a logical product of the two input signals;
a second inverter gate that inverts an output signal of the second NAND gate to output a resulting signal;
a first PMOS transistor that has a drain connected to an output of the first NAND gate, has a gate connected to an output of the second NAND gate and has a source connected to a power supply voltage; and
a first NMOS transistor that has a drain connected to an output of the first inverter gate, has a gate connected to an output of the second inverter gate and has a source connected to a ground potential.

2. The logic circuit according to claim 1, wherein the first pulse signal is brought to a power supply potential on activation and is brought to the ground potential after a preset time,
the second pulse signal is activated at the same time as the first pulse signal is brought to the ground potential,
the second pulse signal is set to the ground potential after a preset time,
in case the first selection signal is activated, the first selection signal is set to a power supply potential before activation of the first pulse signal, the first selection signal being kept at the power supply potential until the second pulse signal is activated and then transitions to the ground potential, and
in case the first selection signal is not activated, the first selection signal is set to the ground potential before the first pulse signal is activated, the first selection signal being kept at the ground potential until the second pulse signal is activated and then transitions to the ground potential.

3. The logic circuit according to claim 2, wherein, in case the first selection signal is activated, a third pulse signal is output from the first inverter gate after a preset time in synchronization with the first pulse signal, and
a fourth pulse signal is output from the second inverter gate after a preset time in synchronization with the second pulse signal.

4. The logic circuit according to claim 3, wherein a size of the PMOS transistor that composes the first NAND gate is less than or equal to a size of the first PMOS transistor, and
a size of the NMOS transistor that composes the first inverter gate is less than or equal to a size of the first NMOS transistor, thereby shortening a delay time as from activation of the first pulse signal until activation of the third pulse signal.

5. An address decoder circuit comprising an array of a plurality of the logic circuits according to claim 4.

6. The address decoder circuit according to claim 5, wherein the fourth pulse signal is not output from the last stage logic circuit of the plurality of the logic circuits.

7. A logic circuit comprising:
a first NAND gate that receives a first pulse signal and a first selection signal as inputs to output an inverted version of a logical product of the two input signals;
a first inverter gate that inverts an output signal of the first NAND gate to output a resulting signal;

a latch circuit that receives a second pulse signal and that latches an inverted version of the second pulse signal in response to an output signal of the first inverter gate;

a second inverter gate that inverts an output signal of the latch circuit to output a resulting signal;

a first PMOS transistor that has a drain connected to an output of the first NAND gate; has a gate connected to an output of the latch circuit and has a source connected to a power supply voltage; and a first NMOS transistor that has a drain connected to an output of the first inverter gate, has a gate connected to an output of the second inverter gate and has a source connected to a ground potential.

8. The logic circuit according to claim 7, wherein the latch circuit includes a third inverter gate that inverts an output signal of the first inverter gate;

a third NAND gate that receives the second pulse signal at a first input thereof; and a fourth NAND gate that receives an output signal of the third inverter gate and an output signal of the third NAND gate, an output of the fourth NAND gate being connected to a second input of the third NAND gate.

9. The logic circuit according to claim 7, wherein the first pulse signal is brought to a power supply potential on activation and is brought to the ground potential after a preset time, the second pulse signal is activated at the same time as the first pulse signal is brought to the ground potential, the second pulse signal being set to the ground potential after a preset time, in case the first selection signal is activated, the first selection signal is set to the power supply potential before activation of the first pulse signal, the first selection signal being kept at the power supply potential until the first pulse signal is activated and then transitions to the ground potential, and in case the first selection signal is not activated, the first selection signal is brought to the ground potential before the first pulse signal is activated, the first selection signal being set to the ground potential until the first pulse signal is activated and then transitions to the ground potential.

10. The logic circuit according to claim 9, wherein, in case the first selection signal is activated, a third pulse signal is output from the first inverter gate after a preset time in synchronization with the first pulse signal, and a fourth pulse signal is output from the second inverter gate after a preset time in synchronization with the second pulse signal.

11. The logic circuit according to claim 10, wherein a size of the PMOS transistor that composes the first NAND gate is set so as to be less than or equal to a size of the first PMOS transistor;

a size of the NMOS transistor that composes the first inverter gate is set so as to be less than or equal to a size of the first NMOS transistor, thereby shortening the delay time as from activation of the first pulse signal until activation of the third pulse signal.

12. An address decoder circuit comprising an array of a plurality of the logic circuits, each as set forth in claim 11.

13. The address decoder circuit according to claim 12, wherein the fourth pulse signal is not output from the last stage logic circuit of the plurality of the logic circuits.

14. A semiconductor memory including the address decoder circuit as set forth in claim 5.

15. A logic circuit comprising:
a first circuit that takes an inverted version of a logical product of a first signal supplied to a first input terminal and a second signal supplied to a second input terminal;

a second circuit that receives an output signal of the first circuit to output an inverted version of the output signal at a first output terminal;

a third circuit that takes an inverted version of a logical product of the second signal supplied to the second input terminal and a third signal supplied to a third input terminal;

a fourth circuit that receives an output signal of the third circuit to output a signal which is an inverted version of the output signal at a second output terminal;

a first switch element connected between an output of the first circuit and a first power supply, the first switch element being controlled to be on or off based on an output of the third circuit; and a second switch element connected between an output of the second circuit and a second power supply, the second switch element being controlled on or off based on an output of the fourth circuit.

16. The logic circuit according to claim 15, comprising a third circuit that latches an input signal supplied to a third input terminal in response to an output of the second circuit, in place of the third circuit that takes an inverted version of a logical product of the second signal supplied to the second input terminal and a third signal supplied to a third input terminal.

17. An address decoder circuit including a logic circuit according to claim 15; wherein
the first signal is a clock pulse,
the second signal is an enabling signal, and
the third signal is a reset pulse.

* * * * *